United States Patent
Gosain et al.

(10) Patent No.: US 8,115,188 B2
(45) Date of Patent: Feb. 14, 2012

(54) MEMORY ELEMENT AND DISPLAY DEVICE

(75) Inventors: Dharam Pal Gosain, Tokyo (JP); Makoto Takatoku, Kanagawa (JP); Yoshiharu Nakajima, Kanagawa (JP); Tsutomu Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 334 days.

(21) Appl. No.: 12/320,307

(22) Filed: Jan. 23, 2009

(65) Prior Publication Data

US 2009/0194760 A1 Aug. 6, 2009

(30) Foreign Application Priority Data

Feb. 1, 2008 (JP) .................................. 2008-022900
Dec. 5, 2008 (JP) .................................. 2008-310441

(51) Int. Cl.
*H01L 45/00* (2006.01)
*G11C 11/00* (2006.01)

(52) U.S. Cl. .......... 257/4; 257/5; 257/E45.003; 365/148
(58) Field of Classification Search .................. 257/4, 5, 257/E45.002, E45.003, 59, 72; 365/148, 365/158

See application file for complete search history.

(56) References Cited

U.S. PATENT DOCUMENTS

| | | | |
|---|---|---|---|
| 4,996,523 A | 2/1991 | Bell et al. | |
| 6,583,490 B2* | 6/2003 | Hagiwara et al. | 257/530 |
| 7,247,357 B2* | 7/2007 | Shiba et al. | 428/1.51 |
| 2004/0174732 A1* | 9/2004 | Morimoto | 365/148 |
| 2008/0203378 A1* | 8/2008 | Tanaka et al. | 257/5 |

FOREIGN PATENT DOCUMENTS

| | | |
|---|---|---|
| JP | 02-148687 A | 6/1990 |
| JP | 11-052416 | 2/1999 |
| JP | 2004-070186 A | 3/2004 |
| JP | 2004-272975 A | 9/2004 |
| JP | 2005-010448 A | 1/2005 |
| JP | 2006-253679 A | 9/2006 |
| JP | 2006-295168 A | 10/2006 |
| JP | 2007-115956 A | 5/2007 |
| JP | 2008-160004 A | 7/2008 |
| JP | 2009-033177 A | 2/2009 |

OTHER PUBLICATIONS

M. Senda et al., "Ultra Low Power Polysilicon AMLCD with Full Integration," SID 02 Digest, pp. 790-793.

(Continued)

*Primary Examiner* — Victor A Mandala
*Assistant Examiner* — Scott Stowe
(74) *Attorney, Agent, or Firm* — Rader, Fishman & Grauer PLLC

(57) ABSTRACT

Disclosed herein is a memory element, including a parallel combination of a thin film transistor; and a resistance change element, the thin film transistor including a semiconductor thin film in which a channel region, and an input terminal and an output terminal located on both sides of the channel region, respectively, are formed, and a gate electrode overlapping the channel region through an insulating film to become a control terminal, the resistance change element including one conductive layer connected to the input terminal side of the thin film transistor, the other conductive layer connected to the output terminal side of the thin film transistor, and at least one oxide film layer disposed between the one conductive layer and the other conductive layer.

9 Claims, 15 Drawing Sheets

OTHER PUBLICATIONS

S. Q. Liu, et al., "Electric-pulse-induced Reversible Resistance Change Effect in Magnetoresistive Films," Space Vacuum Epitaxy Center and Texas Center for Superconductivity, University of Houston, Appl. Phys. Lett., vol. 76, No. 19, pp. 2749-2751, May 8, 2000.

Akihito Sawa, et al., "Colossal Electro-Resistance memory Effect at Metal/La2CuO4 Interfaces," JJAP Express Letter, Japanese Journal of Applied Physics, vol. 44, No. 40, 2005, pp. L1241-L1243.

Japanese Office Action issued May 6, 2010 for corresponding Japanese Application No. 2008-310441.

* cited by examiner

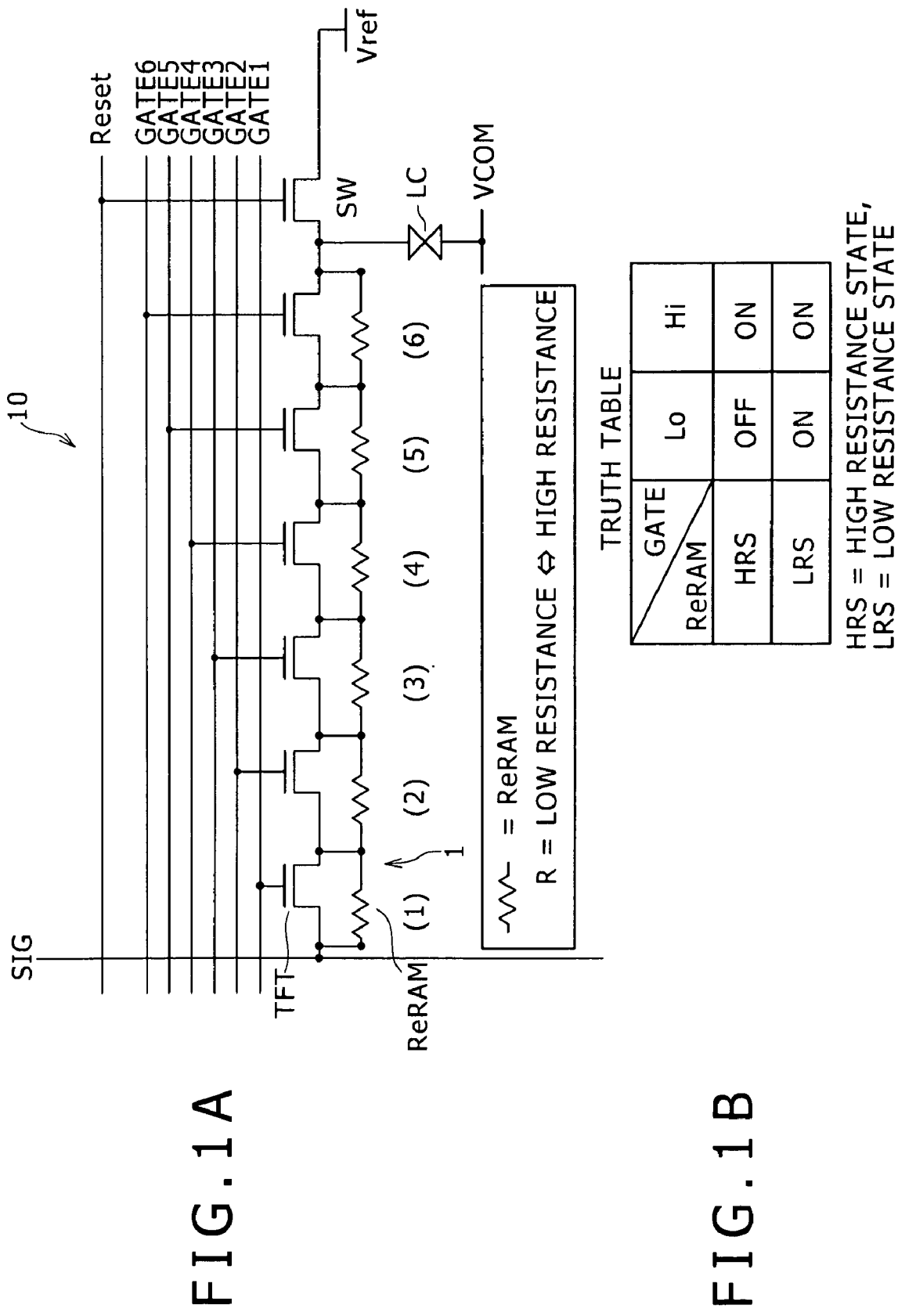

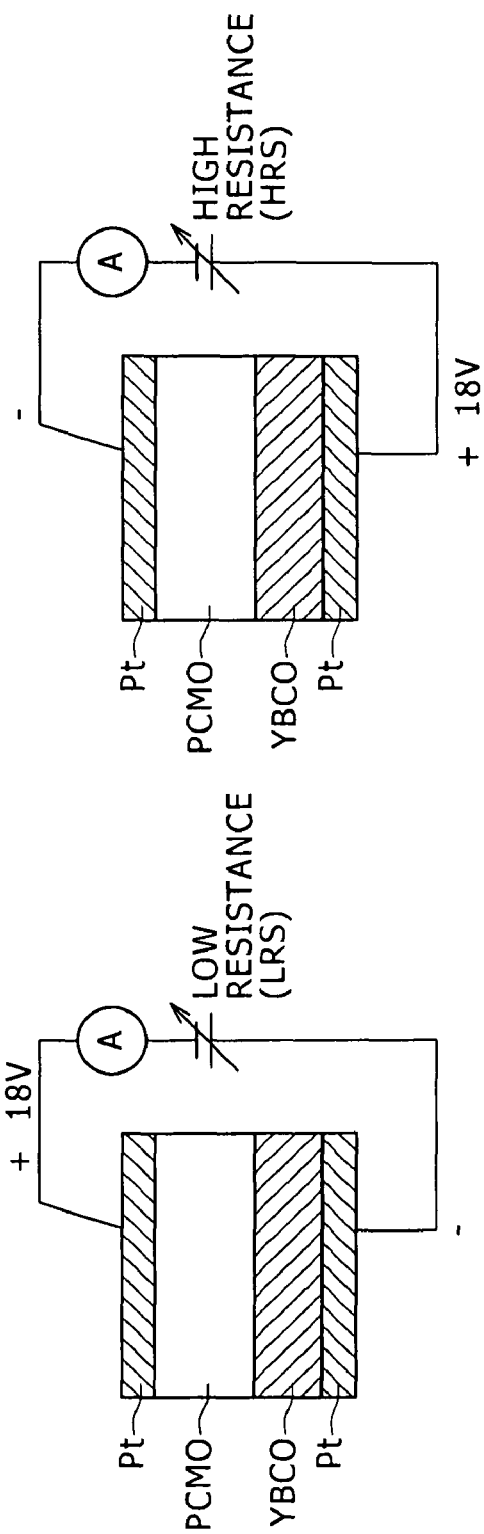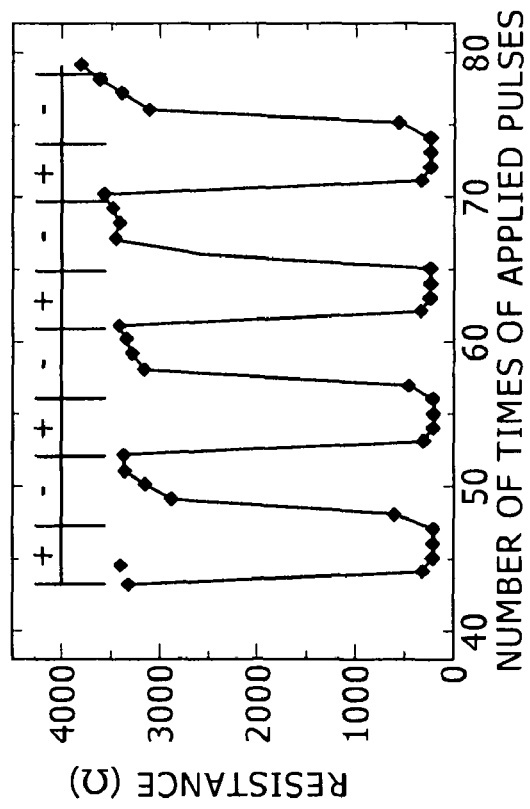

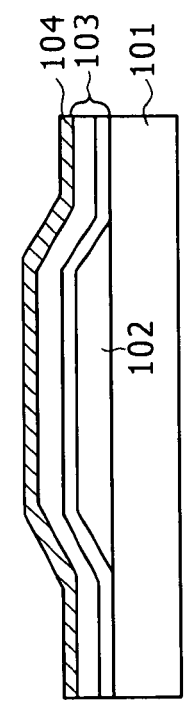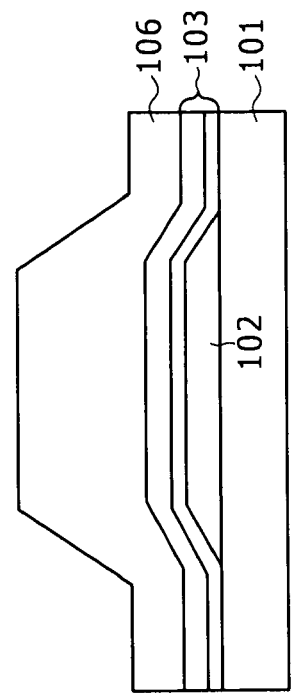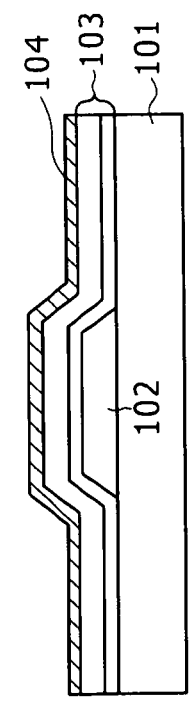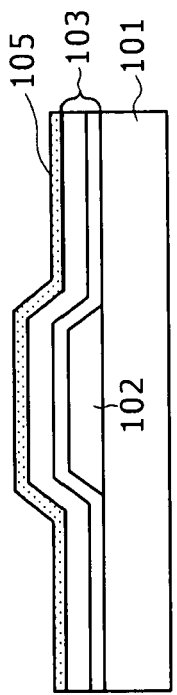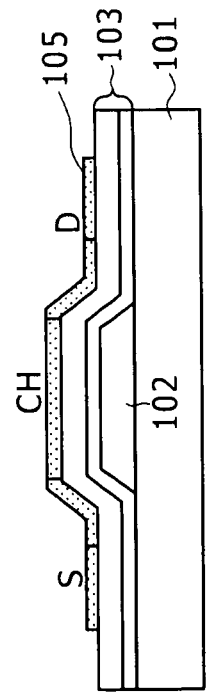
FIG. 3A  FIG. 3B  FIG. 3C  FIG. 3D

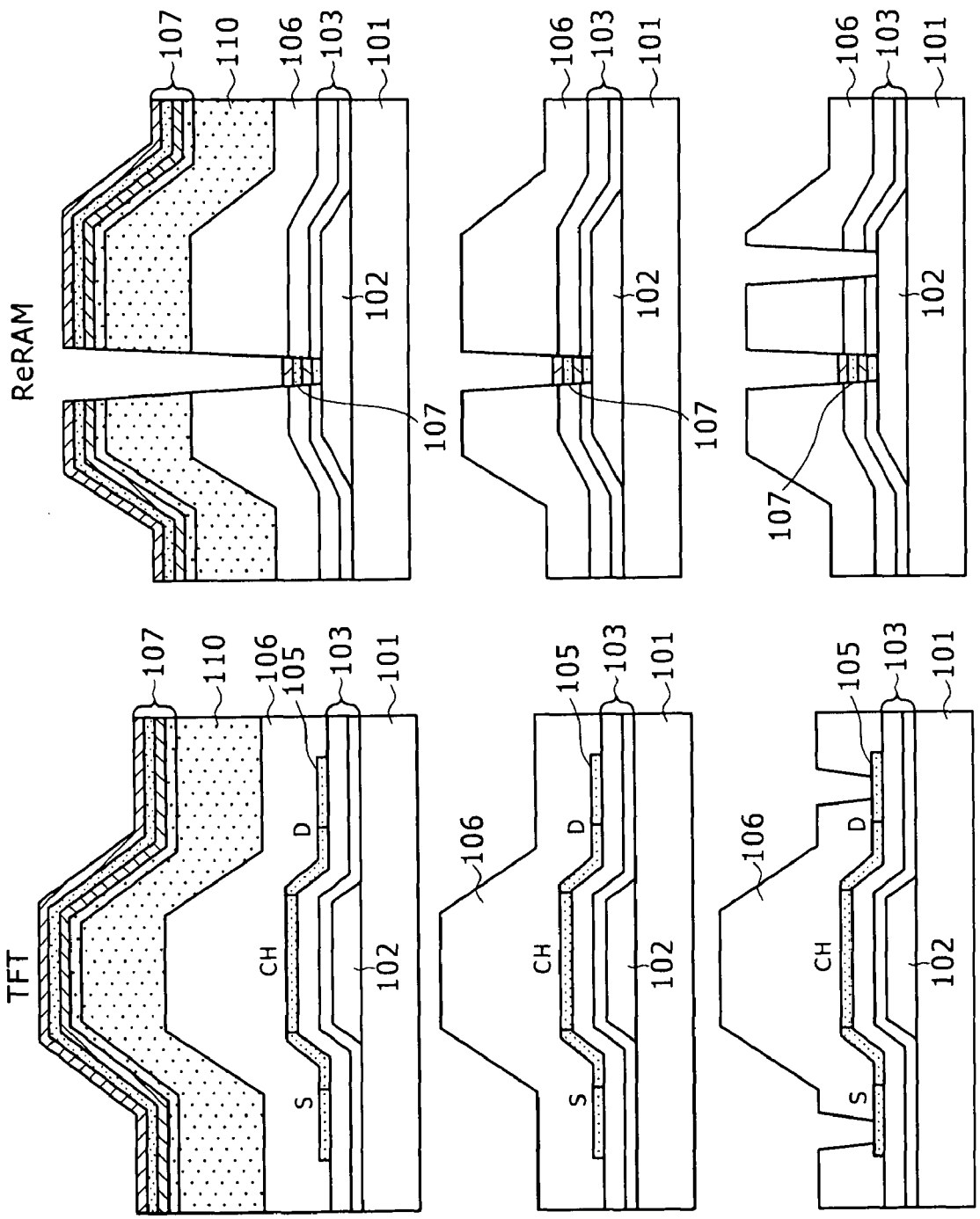

MEMORY ELEMENT AND DISPLAY DEVICE

CROSS REFERENCES TO RELATED APPLICATIONS

The present invention contains subject matter related to Japanese Patent Application JP 2008-310441 filed in the Japan Patent Office on Dec. 5, 2008 and Japanese Patent Application JP 2008-022900 filed in the Japan Patent Office on Feb. 1, 2008, the entire contents of which being incorporated herein by reference.

BACKGROUND OF THE INVENTION

1. Field of the Invention

The present invention relates to a memory element, and more particularly to a memory element which is suitable for driving a pixel in an active matrix type liquid crystal display device. In addition, the present invention relates to an active matrix type liquid crystal display device in which such memory elements are formed in each of pixels.

2. Description of the Related Art

An active matrix type liquid crystal display device includes gate lines wired in rows, data lines wired in columns, and pixels disposed in portions in which both the gate lines and the data lines intersect with each other, respectively. An electro-optic element typified by a liquid crystal cell, and an active element such as a thin film transistor for driving the electro-optic element are formed in each of the pixels. A gate of the thin film transistor is connected to corresponding one of the gate lines, a source thereof is connected to corresponding one of the data lines, and a drain thereof is connected to corresponding one of the electro-optic elements. In the active matrix type liquid crystal display device, the gate lines are scanned in a line-sequential manner, and a video signal (data) is supplied to the data lines wired in columns in correspondence to the scanning operation, thereby displaying an image corresponding to the video signal in a pixel array.

In the active matrix type liquid crystal display device, the gate lines are scanned in the line-sequential manner every one field, and the video signal is supplied to the data lines in correspondence to the scanning operation. In the case of display of a moving image, since a picture is switched over to another one every one field, it is necessary for the data lines to repeat charge and discharge of the video signal every one field. When a liquid crystal display panel of the active matrix type liquid crystal display device is driven, the most part of power consumption is consumed for the charge and discharge of the data lines.

The lowering of a rewrite frequency (field frequency) of an image is effective in suppression of the power consumption consumed for the charge and discharge of the data lines. However, it is well known that when the field frequency is lowered to 30 to 60 Hz or less, a flicker occurs in a screen, thereby deteriorating the display characteristics. In order to cope with this problem, heretofore, a system for giving each of the pixels a memory function, thereby reducing the number of times of the charge and discharge is proposed as the means for saving the power consumption without lowering the field frequency. This technique, for example, is described in Japanese Patent Laid-Open No. Hei 11-52416, a non-patent literary document 1 of M. Senda et al.: "Ultra low power polysilicon AMLCD with full integration" SID2002, p. 790, a non-patent literary document 2 of S. Q. Liu, N. J. Wu, and A. Ignatieva: "Space Vacuum Epitaxy Center and Texas Center for Superconductivity," University of Houston, Houston, Tex. 77204-5507, "Electric-pulse-induced reversible resistance change effect in magnetoresistive films," APPLIED PHYSICS LETTERS, VOLUME 76, NUMBER 19, 8 May 2000, and a non-patent literary document 3 of Akihito SAWA, Takeshi FUJII, Masashi KAWASAKI and Yoshinori TOKURA: "Colossal Electro-Resistance Memory Effect at Metal/$La_2CuO_4$ Interfaces," Japanese Journal of Applied Physics, Vol. 44, No. 40, 2005, pp. L1241 to L1243.

SUMMARY OF THE INVENTION

The search of the technique is emerging such that when there is no change in input video signal as in the case or the like of a still image, the data held with the memory function within each of the pixels is continued to be displayed in the form of the still image in order to reduce the number of times of the charge and discharge of the data lines, thereby promoting the low power consumption.

For example, a system is provided such that in order to incorporate the memory function in each of the pixels of the liquid crystal display panel, SRAM memory elements are formed in the respective pixels integrally with one another. However, the SRAM memory element uses at least six transistors per 1 bit. Therefore, when 64-gradation display is carried out with six dots per one pixel, an effective opening area of each of the pixels is squeezed all the more because thirty-six (=6×6) transistors need to be formed integrally with one another per one pixel. In this case, it may be impossible to obtain a bright picture because the area of the pixel openings adapted to transmit a light, from a backlight, desired for the display is reduced. As a result, when an existing memory element is tried to be directly incorporated in each of the pixels, it becomes difficult to promote the multiple bits, and thus there occurs a restriction to the high-definition and multiple gradation display. This becomes a problem to be solved.

Japanese Patent Laid-Open No. Hei 11-52416 describes an example of using a ferroelectric substance as a system for realizing the memory function incorporated in each of the pixel. In this case, there is no possibility that the opening area is squeezed because it is unnecessary to form any of circuit elements such as a transistor in each of the pixels. However, the practical level is not reached because a suitable material for the ferroelectric substance having the memory function is poor. Thus, it is said that it is difficult to ensure the reliability of the memory function because the ferroelectric characteristics and the insulating property are easy to change when data is rewritten repeatedly.

In the light of the problems peculiar to the existing technique described above, it is therefore desirable to provide a micro-miniature memory element which is capable of being incorporated in a pixel. It is also desirable to provide an active matrix type display device having such a micro-miniature memory element incorporated therein. In order to attain the desire described above, according to an embodiment of the present invention, there is provided a memory element, including a parallel combination of a thin film transistor and a resistance change element; the thin film transistor including: a semiconductor thin film in which a channel region, and an input terminal and an output terminal located on both sides of the channel region, respectively, are formed, and a gate electrode overlapping the channel region through an insulating film to become a control terminal; and the resistance change element including one conductive layer connected to the input terminal side of the thin film transistor, the other conductive layer connected to the output terminal side of the thin film transistor, and at least one oxide film layer disposed between the one conductive layer and the other conductive layer; in which when the thin film transistor is in an OFF state in accordance with a voltage applied to the control terminal of the thin film transistor, the resistance change element changes between a low resistance state and a high resistance state in accordance with a voltage applied thereto from the input terminal of the thin film transistor, thereby writing corresponding binary data to the resistance change element.

According to another embodiment of the present invention, there is provided a display device, including: gate lines wired in rows, data lines wired in columns, and pixels disposed in portions in which the gate lines and the data lines intersect with each other, respectively; each of the pixels including a memory element and an electro-optic element; the memory element serving to store therein data supplied thereto from the corresponding one of the data lines, and to read out data in accordance with a signal supplied thereto from the corresponding one of the gate lines; the electro-optic element exhibiting a luminance corresponding to the data stored in the memory element; the memory element including a parallel combination of a thin film transistor and a resistance change element; the thin film transistor including: a semiconductor thin film in which a channel region, and an input terminal and an output terminal located on both sides of the channel region, respectively, are formed, and a gate electrode overlapping the channel region through an insulating film to become a control terminal; and the resistance change element including one conductive layer connected to the input terminal side of the thin film transistor, the other conductive layer connected to the output terminal side of the thin film transistor, and at least one oxide film layer disposed between the one conductive layer and the other conductive layer; in which when the thin film transistor is in an OFF state in accordance with a voltage applied from the corresponding one of the gate lines to the control terminal of the thin film transistor, the resistance change element changes between a low resistance state and a high resistance state in accordance with data supplied from the corresponding one of the data lines to the input terminal of the thin film transistor, thereby writing the data to the resistance change element.

According to the embodiments of the present invention, the memory element is composed of the thin film transistor (TFT) and the resistance change element (ReRAM). The circuit scale is very simplified and miniaturized as compared with the existing SRAM (Static Random Access Memory). A plurality of memory elements thus miniaturized is readily incorporated in the pixel, and thus the memory having a multiple bit configuration can be built in the pixel with a small area. Therefore, it is possible to realize the active matrix type display device which is capable of performing multiple gradation display with the practical pixel size.

Since the multiple bit memory can be built in the pixel, it is possible to reduce the power consumption which is necessary for the charge and discharge for the data lines and which occupies the most part of the power consumption in the liquid crystal display panel except for a backlight. As a result, it is possible to realize the liquid crystal display panel of the active matrix type liquid crystal display device which is capable of being driven with the low power consumption. Incorporating such a liquid crystal panel in a monitor of a mobile device results in that the reduction of the battery volume as well as the prolonging of intervals of charging of a battery can be carried out. As a result, it is possible to further miniaturize the mobile device.

BRIEF DESCRIPTION OF THE DRAWINGS

FIGS. 1A and 1B are respectively a schematic circuit diagram showing a configuration of a memory element and a display device according to a first embodiment of the present invention, and a diagram showing a truth table;

FIGS. 2A, 2B and 2C are respectively a schematic view of a resistance change element in a low resistance state, a schematic view of the resistance charge element in a high resistance state, and a graph showing electrical characteristics of the resistance change element, the resistance change element being incorporated in the memory element according to the first embodiment of the present invention;

FIGS. 3A to 3H are respectively schematic cross sectional views showing respective processes in a method of manufacturing the memory element according to the first embodiment of the present invention;

DETAILED DESCRIPTION OF THE PREFERRED EMBODIMENTS

Figure 3H:
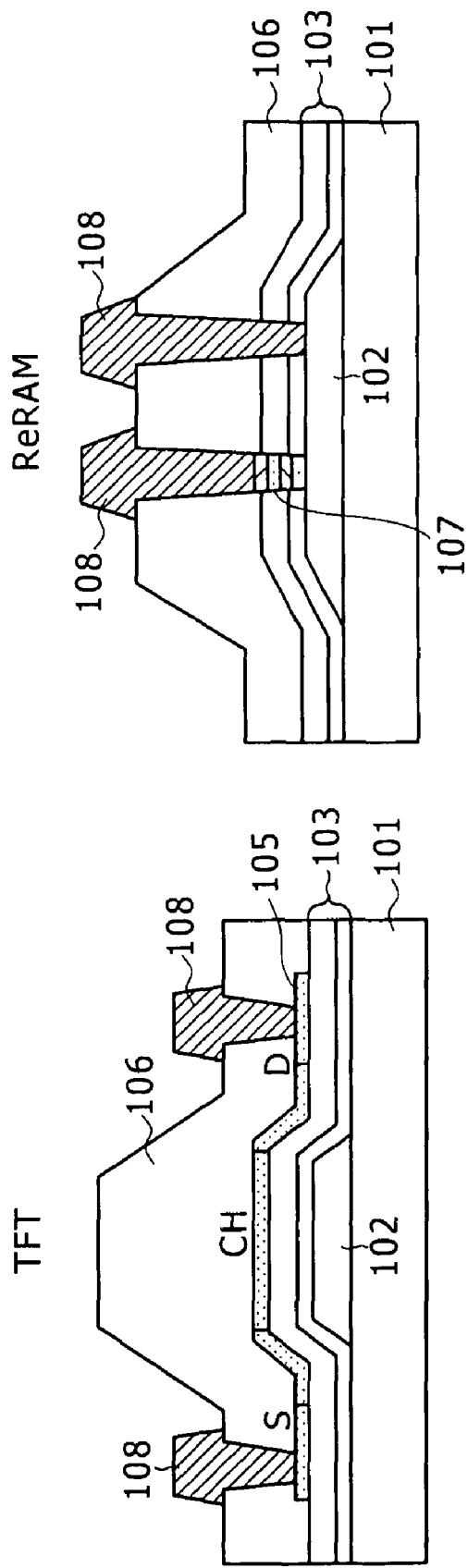

Preferred embodiments of the present invention will be described in detail hereinafter with reference to the accompanying drawings. Note that, the description will be given below in the order of a first embodiment, a second embodiment, examples of application, and a third embodiment.

First Embodiment

Entire Configuration

FIGS. 1A and 1B are respectively a schematic diagram showing a configuration of a memory element and a display device according to a first embodiment of the present invention, and a diagram showing a truth table. This schematic diagram is a schematic circuit diagram showing a portion for one pixel of an active matrix type liquid crystal display device. A pixel 10 includes a memory element 1.

As shown in FIG. 1A, the memory element 1 is composed of a parallel combination of a thin film transistor TFT and a resistance change element ReRAM. The TFT includes a semiconductor thin film in which a channel region, and an input terminal and an output terminal (a source and a drain) located on both sides of the channel region, respectively, are formed, and a gate electrode overlapping the channel region through an insulating film to become a control terminal. The resistance change element ReRAM is composed of one conductive layer connected to the input terminal side of the TFT, the other conductive layer connected to the output terminal side of the TFT, and at least one oxide layer disposed between the one conductive layer and the other conductive layer. When the TFT is in an OFF state in accordance with a voltage applied to the control terminal (gate electrode) thereof, the resistance change element ReRAM changes between a low resistance state LRS and a high resistance state HRS in accordance with a voltage applied from the input terminal of the TFT, thereby writing corresponding binary data to the resistance change element ReRAM. In the case shown in the FIG. 1A, a plurality of stages (1) to (6) of the parallel combinations of the TFTs and the resistance change elements ReRAMs are connected in series with one another. Also, the voltages applied to the control terminals of the TFTs of the stages, respectively, are controlled, thereby reading out the binary data written to the resistance change elements ReRAMs in the respective stages.

Subsequently, a configuration of the active matrix type liquid crystal display device will be described. The active matrix type liquid crystal display device includes gate lines GATEs wired in rows, data lines SIGs wired in columns, and pixels 10 disposed in portions in which the gate lines GATEs and the data lines SIGs intersect with each other, respectively. FIG. 1A shows merely one pixel 10. The pixel 10 includes the memory element 1 and an electro-optic element. In the case shown in FIG. 1A, the electro-optic element is a liquid crystal cell LC. The liquid crystal cell LC is composed of a pixel electrode, a counter electrode, and a liquid crystal layer held between the pixel electrode and the counter electrode. The counter electrode is connected to a counter potential VCOM common to all the pixels, while the pixel electrode is connected to the memory element 1.

The memory element 1 stores therein data supplied thereto from corresponding one of the data lines SIGs, and reads out therefrom the data in accordance with a signal supplied thereto from the corresponding one of the gate lines GATEs. The liquid crystal cell LC as the electro-optic element exhibits a luminance corresponding to the data stored in the memory element 1.

As previously stated, the memory element 1 is composed of the parallel combination of the TFT and the resistance change element ReRAM. The TFT includes the semiconductor thin film in which the channel region, and the input terminal and the output terminal (the source and the drain) located on the both sides of the channel region, respectively, are formed, and the gate electrode overlapping the channel region through the insulating film to become the control terminal. The resistance change element ReRAM is composed of the one conductive layer connected to the input terminal side of the TFT, the other conductive layer connected to the output terminal side of the TFT, and at least one oxide layer disposed between the one conductive layer and the other conductive layer. When the TFT is in the OFF state in accordance with the signal applied from the corresponding one of the gate lines GATEs to the control terminal (gate electrode) thereof, the resistance change element ReRAM changes between the low resistance state LRS and the high resistance state HRS in accordance with the data supplied from the corresponding one of the data lines SIGs to the input terminal of the TFT, thereby storing therein the data concerned.

In the first embodiment, the pixel 10 includes a plurality of memory elements (1) to (6) connected in series between the data line SIG and the liquid crystal cell LC. The plurality of memory elements (1) to (6) are controlled in a time division manner through a plurality of gate lines GATE1 to GATE6 wired so as to correspond to the plurality of memory elements (1) to (6), respectively, thereby writing multiple bit data corresponding to the multiple gradations to the memory element 1. Moreover, the liquid crystal cell LC is driven in the time division manner in correspondence to the multiple bit data written to the memory element 1, thereby controlling the luminance of the liquid crystal cell LC with the multiple gradations.

Subsequently, the operation of the active matrix type liquid crystal display device will be described with reference to FIG. 1A. The operation of the pixel 10 is roughly classified into an operation for writing the multiple bit data to the memory elements (1) to (6), and an operation for reading out the multiple bit data from the memory elements (1) to (6). For the purpose of carrying out the writing operation, the pixel 10 is provided with a switch SW. This switch SW is also composed of a thin film transistor TFT. One current terminal of the switch SW is connected to the serial combination of the memory element 1, while a predetermined reference potential Vref is applied to the other current terminal of the switch SW. A control line Reset for write is connected to a control terminal (gate electrode) of the switch SW.

The pixel 10 uses a 6-bit memory in which six memory elements (1) to (6) are connected. Specifically, the six resistance change elements ReRAMs are connected in parallel with the six TFTs, respectively. Each of the resistance change elements ReRAMs is switched between the high resistance state HRS and the low resistance state LRS, thereby storing therein corresponding one of the bit data. Firstly, after all the resistance change elements ReRAMs, for example, are initialized to the high resistance state HRS, the bit data is written to the first memory element (1). Specifically, the gate line GATE1 of the memory element (1) is set at a low level Lo to turn OFF the corresponding one of the TFTs, while all other memory elements (2) to (6) are set at a high level Hi to turn ON the corresponding ones of the TFTs. In addition, the control line Reset for write is also set at the high level Hi to turn ON the switch SW. As a result, the bit data is supplied from the corresponding one of the data lines SIGs to the input terminal side of the resistance change element ReRAM of the first memory element (1), and the predetermined reference potential Vref is applied to the output terminal of the resistance change element ReRAM of the first memory element (1) through the TFTs of the memory elements (2) to (6), and the switch SW each set at the ON state. When the bit data applied from the corresponding one of the data lines SIGs is set at a higher level than that of the predetermined reference potential Vref (in other words, when the signal voltage having the positive polarity is applied), the resistance change element ReRAM changes from the high resistance state HRS over to the low resistance state LRS. As a result, the bit data "1" is written to the memory element (1). Conversely, when the negative data voltage is supplied from the corresponding one of the data lines SIGs, the resistance change element ReRAM of the memory element (1) holds the high resistance state HRS as it is. That is to say, when the signal voltage having the negative polarity is applied, the bit data "0" is written to the memory element (1).

When the bit data is written to the second memory element (2) so as to follow the above write operation, the TFT of the memory element (2) is turned OFF, while the TFTs of the remaining memory elements, i.e., the memory element (1), and the memory elements (3) to (6), and the switch SW are all turned ON. When in this state, the signal voltage (the bit data "1") having the positive polarity with respect to the reference potential Vref is applied from the corresponding one of the data lines SIGs, the resistance change element ReRAM of the memory element (2) is set at the low resistance state LRS, thereby writing the bit data "1" to the memory element (2). Conversely, when the signal voltage supplied from the corresponding one of the data lines SIGs has the negative polarity with respect to the reference potential Vref (i.e., the bit data "0" is supplied), the resistance change element ReRAM of the memory element (2) holds the high resistance state HRS as it is, thereby writing the bit data "0" to the memory element (2). In such a manner, the corresponding ones of the gate lines GATEs, and the control line Reset are successively controlled in the time division manner for the memory elements (3) to (6) so as to follow the write operation for the memory element (2), thereby writing the corresponding bit data to the memory elements (3) to (6) in order. In such a manner, the TFT of the memory element as an object to which the bit data is intended to be written is turned OFF, while the TFTs of the remaining memory elements are each turned ON, thereby making it possible to write the bit data to the memory element as the object.

Next, an operation for reading out the multiple bit data (i.e., a radiation operation for the pixel 10) will be described in detail. In the read operation, the switch SW for write is held in the OFF state. As a result, the pixel 10 includes the six memory elements (1) to (6) connected in series between the corresponding one of the data lines SIGs, and the liquid crystal cell LC. The memory elements (1) to (6) are controlled in the time division manner through a plurality of gate lines GATE1 to GATE6 corresponding to the memory elements (1) to (6), respectively, thereby reading out the multiple bit data from the memory elements (1) to (6). In response to this read operation, the liquid crystal cell LC is driven, thereby controlling the luminance of the liquid crystal cell LC with the multiple gradations. In the case of the first embodiment, since the six bit memory cells 1 are used, the liquid crystal cell LC can be controlled with the sixty-four (=6 power of 2) gradations.

Specifically, when a time desired to read out the bit data from the first memory element (1) is set as one unit, a time desired to read out the bit data from the second memory element (2) is set as being double the read time in the first memory element (1). Also, a time desired to read out the bit data from the third memory element (3) is set as being quadruple the read time in the first memory element (1). In such a manner, the read time is successively redoubled, and thus a time desired to read out the bit data from the final memory element (6) is set as being 32-fold the read time in the first memory element (1). Here, when the binary data "1" is written to each of the memory elements (1) to (6), a drive current is supplied from the side of the corresponding one of the data lines SIGs to the liquid crystal cell LC over the entire read time, thereby setting the liquid crystal cell LC in a radiation state. Conversely, when the binary data "0" is written to each of the memory elements (1) to (6), the liquid crystal cell LC is set in a non-radiation state because no drive current is caused to flow through the liquid crystal cell LC. For a time period between the full radiation state and the full non-radiation state, the radiation state and the non-radiation state are separately set in the liquid crystal cell LC merely for a time exhibited by the multiple bit data in correspondence to the multiple bit data written to the memory elements (1) to (6). In such a manner, in the active matrix type liquid crystal display device, the liquid crystal cell LC is driven in the time division manner in correspondence to the multiple bit data written to the memory elements (1) to (6) of each of the pixels 10, thereby making it possible to control the luminance of the liquid crystal cell LC with the multiple gradations.

In order to explain the read operation in the memory element 1, reference is now made to a truth table shown in FIG. 1B. As shown in the figure, in the truth table, a transverse column represents the level of the gate line GATE, and a longitudinal column represents the state of the resistance change element ReRAM. When the control signal applied to the gate line GATE is set at the high level Hi, the TFT is held in the ON state. Thus, the drive current can be supplied to the liquid crystal cell LC because the memory element 1 is in a conduction state irrespective of the state of the resistance change element ReRAM. On the other hand, when the control signal applied to the gate line GATE is set at the low level Lo, the TFT is held in the OFF state. At this time, conduction/non-conduction of the memory element 1 depends on the state of the resistance change element ReRAM. That is to say, when the resistance change element ReRAM is held in the high resistance state HRS, both the TFT and the resistance change element ReRAM connected in parallel with each other are held in the high resistance state (high impedance). As a result, the memory element 1 is held in the OFF state as a whole. Conversely, when the resistance change element ReRAM is held in the low resistance state LRS, the drive current is caused to flow through the resistance change element ReRAM held in the low impedance state even when the TFT is held in the OFF state. As a result, the memory element 1 is held in the ON state as a whole. From this, in the memory element 1, the gate potential of the corresponding TFT is set at the low level Lo, which results in that the bit data in the state of being written to the memory element 1 is read out in the form of the drive current for the liquid crystal cell LC. For example, when the bit data is read out from the memory element (1), the gate line GATE1 needs to be set at the low level Lo, while the remaining gate lines GATE2 to GATE6 need to be each set at the high level Hi. As a result, OFF and ON of a current path between the liquid crystal cell LC and the data line SIG can be switched over to each other depending on the OFF and ON states of the memory element (1).

STRUCTURAL EXAMPLE 1 OF RESISTANCE CHANGE ELEMENT

FIGS. 2A and 2B are respectively schematic views showing a concrete structural example of the resistance change element ReRAM. Here, FIG. 2A shows the low resistance state LRS of the resistance change element ReRAM, and FIG. 2B shows the high resistance state HRS of the resistance change element ReRAM. As shown in these figures, the resistance change element ReRAM is composed of a pair of conductive layers, and at least one oxide layer disposed between the conductive layers paired with each other. In the structural example shown in these figures, each of the paired conductive layers is made of a metal Pt (platinum), and two layers of metallic oxide films made of PCMO and YBCO, respectively, are formed between the paired conductive layers. That is to say, in this structural example, the oxide layers are made of the metallic oxides, respectively. When the voltage having the positive polarity of, for example, +18 V is applied to the upper Pt layer with the voltage at the lower Pt layer as a reference, the resistance change element ReRAM is set in the low resistance state LRS. Conversely, when the voltage having the negative polarity is applied to the upper Pt layer with the voltage at the lower Pt layer as the reference, the resistance change element ReRAM is switched from the low resistance state LRS over to the high resistance state HRS.

FIG. 2C is a graph showing the electrical characteristics of the resistance change element ReRAM. In FIG. 2C, an axis of abscissa represents the number of times of the applied pulses, and an axis of ordinate represents the electrical resistance. The electrical characteristics shown in FIG. 2C are obtained as the results of measuring the electrical resistance developed across the pair of Pt layers when the pulse having an amplitude of 18 V is applied across the pair of Pt layers while the polarity of the pulse is periodically changed. As apparent from the graph, the state of the resistance change element ReRAM is switched between the low resistance state and the high resistance state in accordance with the polarity of the applied pulse. Moreover, the low resistance state or the high resistance state is maintained as it is even when the applied voltage is released. For example, when the resistance change element ReRAM is set in the low resistance state LRS by applying thereto the pulse having the positive polarity, the resistance change element ReRAM then maintains the low resistance state LRS as it is even after the applied pulse is released therefrom. After that, when the pulse having the negative polarity is applied, the state of the resistance change element ReRAM is first switched from the low resistance state LRS over to the high resistance state HRS. After that, even when the applied pulse is released therefrom, the resistance change element ReRAM holds the high resistance state HRS as it is.

It is noted that the layer structure of the resistance change element ReRAM is by no means limited to the structural example shown in FIGS. 2A and 2B. That is to say, a layer structure composed of Pt/TiO/Pt, Pt/NiO/Pt, Pt/NiO/TiO/Pt, W/GdO/CuTe/W, Ag/PCMO/Pt, TiN/CuO/Cu, or the like is given as the layer structure of a thin film lamination type resistance change element.

Manufacturing Processes

A method of manufacturing the memory element 1 according to the first embodiment of the present invention will be described in detail hereinafter with reference to FIGS. 3A to 3H. FIGS. 3A to 3H are cross sectional views showing respective manufacturing processes in the method of manufacturing the memory element 1. In these figures, each of manufacturing processes for the TFT is shown on a left-hand side, and each of manufacturing processes for the resistance change element ReRAM is shown on a right-hand side. The TFT and the resistance change element ReRAM are simultaneously formed on a insulating substrate 101 integrally with each other by utilizing the thin film processes. It is noted that in the first embodiment, the TFT has a bottom-gate structure.

Firstly, as shown in FIG. 3A, a metallic film 102 is deposited on the insulating substrate 101 made of a glass or the like to have a thickness of 90 nm by, for example, utilizing a sputtering method. The metallic film 102 is then patterned into a predetermined shape to become the gate electrode of the TFT. In addition, on the resistance change element ReRAM side as well, the metallic film 102 is ensured so as to become wirings for connection. An insulating film 103 is deposited so as to cover the metallic film 102 thus patterned. The insulating film 103 becomes the gate insulating film on the TFT side. The insulating film 103 has a two-layer structure, for example, having a silicon nitride film with 50 nm thickness, and a silicon oxide film with 50 nm thickness, and is deposited in the manner described above by utilizing a CVD method. Moreover, a semiconductor thin film 104 made of amorphous silicon is deposited over the insulating film 103 to have a thickness of 50 nm by utilizing a plasma CVD method. The gate insulating film 103 and the semiconductor thin film 104 are continuously deposited by utilizing the plasma CVD method.

Next, as shown in FIG. 3B, a laser beam is radiated from an exima laser to the amorphous silion thin film 104, which results in that an upper portion of the amorphous silion thin film 104 turns into the polysilicon thin film 105.

Next, as shown in FIG. 3C, an impurity is implanted into the polysilicon thin film 105 at a predetermined concentration, thereby forming a source region S and a drain region D in the polysilicon thin film 105. The impurity implantation is selectively carried out, so that no impurity is implanted into a portion of the polysilicon film 105 located just above the gate electrode, and thus this portion becomes a channel region CH. A low impurity concentrated region (Lightly Doped Drain: LDD) is formed between the channel region CH and the source region S. Likewise, the LDD is also formed between the channel region CH and the drain region D. Moreover, the impurities thus implanted are activated by using an RTA device. Subsequently, the polysilicon film 105 is patterned into an island shape to be an element region of the TFT. In this case, the polysilicon thin film 105 is completely removed on the resistance change element ReRAM side because it is unnecessary to form the polysilion thin film 105 on the resistance change element ReRAM side. An interlayer insulating film 106 is completely deposited so as to cover the TFT having the bottom structure thus formed. For example, the two-layer insulating film 106 having a silicon oxide film with 300 nm thickness, and a silicon nitride film with 300 nm thickness is deposited in the manner described above by, for example, utilizing the plasma CVD method. Moreover, for the purpose of hydrogenating the polysilicon thin film 105 on the TFT side, an annealing treatment is carried out at about 400° C.

Subsequently, as shown in FIG. 3E, the insulating substrate 101 is completely covered with a photo resist 110. The photo resist 110 is then patterned by utilizing a photolithography technique. Dry etching is carried out for the insulating film 103 and the interlayer insulating film 106 through the photo resist 110 thus patterned, thereby forming an opening on the resistance change element ReRAM side. Moreover, the metal (Pt), the metallic oxides (YBCO and PCMO), and a metal are successively evaporated with the photo resist 110 being left, thereby forming the resistance change element ReRAM 107 having a multilayer thin film structure within the opening. As apparent from FIG. 3E, the lowest conductor film of the resistance change element ReRAM 107 contacts the metallic wiring 102. As shown in FIGS. 2A and 2B, the resistance change element ReRAM 107, for example, has the four-layer structure composed of Pt/PCMO/YBCO/Pt.

Next, as shown in FIG. 3F, the used photo resist 110 is removed. As a result, the lamination layer having the metals and the metallic oxides is lifted off from the insulating substrate 101, so that the resistance change element ReRAM 107 is left merely within the contact opened in the interlayer insulating film 106.

Next, as shown in FIG. 3G, the dry etching is carried out for the insulating film 103 and the interlayer insulating film 106 again by using another photo resist as a mask, thereby forming contact holes. The contact hole communicated with the source region S, and the contact hole communicated with the drain region D are formed in the interlayer insulating film 106 on the TFT side. On the other hand, the additional contact hole communicated with the metallic wiring 102 is formed in the insulating film 106 and the interlayer insulating film 103 on the resistance change element ReRAM side.

Next, as shown in FIG. 3H, a three-layer metallic film becoming metallic wirings is formed on the interlayer insulating film 106. This three-layer metallic film has a lamination structure, for example, having a titanium lower layer with 50 nm thickness, an aluminum middle layer with 500 nm thickness, and a titanium upper layer with 50 nm thickness. This three-layer metallic film is patterned into a predetermined shape to become wirings 108. The wiring 108 connected to the source region S, and the wiring 108 contacting the drain region D are formed on the TFT side. On the other hand, the metallic wiring 108 contacting the upper conductive layer, and the metallic wiring 108 connected to the lower conductive layer through the metallic wiring 102 are formed on the resistance change element ReRAM side. Here, the upper conductive layer of the resistance change element ReRAM 107 is connected to the wiring 108 on the side of the source S of the TFT through the metallic wiring 108. On the other hand, the lower conductive layer of the resistance change element ReRAM 107 is connected to the metallic wiring 108 on the side of the drain D of the TFT through the metallic wirings 102 and 108. In such a manner, the TFT and the resistance change element ReRAM 107 are connected in parallel with each other. In this case, the TFT and the resistance change element ReRAM are connected to each other through the wiring 102 in the same layer as that of the gate electrode. In other words, in the first embodiment, the metallic layer becoming the gate electrode is partially utilized as the wiring, thereby electrically connecting the TFT and the resistance change element ReRAM to each other on the same insulating substrate 101.

It is noted that although not illustrated, after completion of the process shown in FIG. 3H, an organic planarizing film is deposited so as to cover the TFT and the resistance change element ReRAM 107. A contact which is communicated with the drain region D of the TFT is opened in the organic planarizing film. After that, a transparent conductive film made of an ITO is deposited on the organic planarizing film, and is then patterned into a predetermined shape to be made a pixel electrode. The pixel electrode is connected to the side of the drain D of the TFT through the contact opened through the organic planarizing film. In such a manner, it is possible to manufacture the active matrix type liquid crystal display device in which the memory element composed of the parallel combination of the TFT and the resistance change element ReRAM is built.

Second Embodiment

Manufacturing Processes

A method of manufacturing a liquid crystal display device according to a second embodiment of the present invention will be described in detail hereinafter with reference to FIGS. 4A to 4I. In the second embodiment, the memory element is formed on the side of a peripheral circuit for driving the pixel as well as on the pixel side. In each of FIGS. 4A to 4I, a process for forming a pixel portion is shown on the left-hand side, and a process for forming a peripheral circuit portion is shown on the right-hand side. However, the pixel portion and the peripheral circuit portion are simultaneously formed on an insulating substrate by utilizing the semiconductor processes. It is noted that unlike the first embodiment shown in FIGS. 3A to 3H, in the second embodiment, the TFT having a top-gate stricture is formed.

Figure 4A:
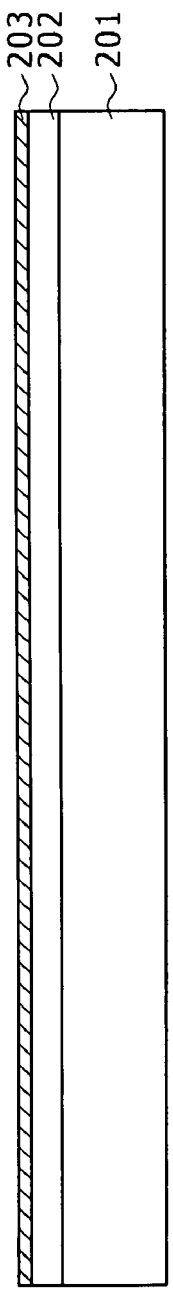
FIGS. 4A to 4I are respectively schematic cross sectional views showing respective processes in a method of manufacturing the memory element according to a second embodiment of the present invention.

Firstly, as shown in FIG. 4A, a buffer layer 202 and an amorphous silicon layer 203 are continuously deposited on an insulating substrate 201 by utilizing a plasma CVD method. The amorphous silicon layer 203, for example, has a thickness of 50 nm. A laser beam is radiated from an exima laser to the amorphous silicon layer 203, so that the amorphous silicon layer 203 turns into a polysilicon film 203.

Figure 4B:
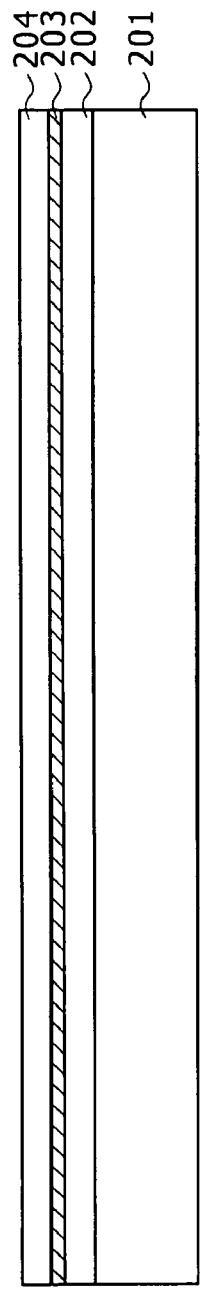

Next, as shown in FIG. 4B, the polysilicon film 203 is covered with a gate insulating film 204. The gate insulating film 204, for example, is formed from a silicon oxide or a silicon nitride film.

Figure 4C:
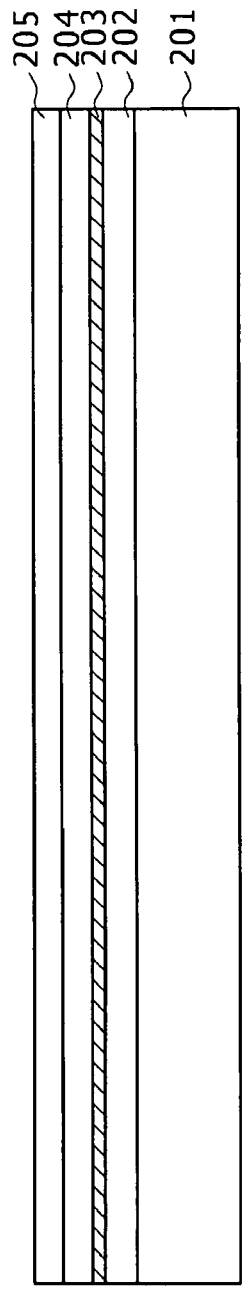

Next, as shown in FIG. 4C, a conductive film 205 is deposited on the gate insulating film 204. The conductive film 205 is made of a high-melting-point metallic material or a conductive polysilicon film.

Figure 4D:
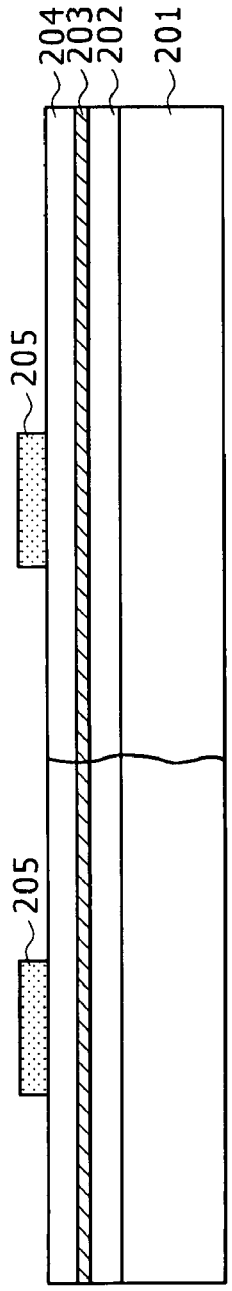

Next, as shown in FIG. 4D, the conductive film 205 is patterned into a predetermined shape to be processed into gate electrodes 205. As shown in the figure, the gate electrodes 205 are formed in both a pixel region and a peripheral circuit region, respectively. It is noted that the left-hand side of the insulating substrate 201 corresponds to a region in which a pixel is intended to be formed, and the right-hand side thereof corresponds to a region in which the peripheral circuit is intended to be formed. In order to make this situation clear, in each of FIGS. 4D to 4I, a boundary line is drawn at a central portion of the insulating substrate 201.

Figure 4E:
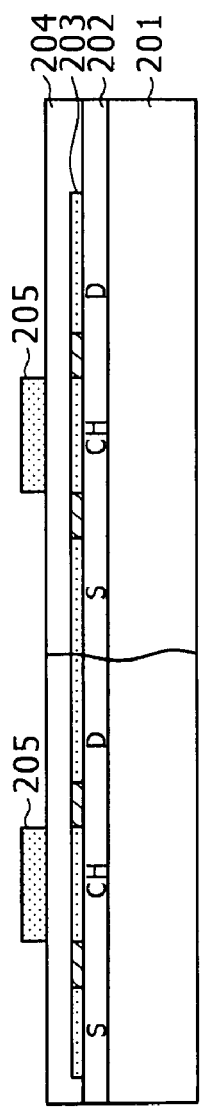

Next, as shown in FIG. 4E, an impurity is selectively implanted into the polysilicon film 203 through the insulating film 204 by using the gate electrodes 205 as a mask. As a result, a source region S and a drain region D are formed in the polysilicon film 203 on each of both the element region side and the peripheral circuit region side. In addition, a channel region CH having no impurity implanted thereinto is formed just under the gate electrode 205 on each of the both sides. In addition thereto, an LDD region obtained through impurity implantation made at a low concentration is provided between the channel region CH and the source region S on each of the both sides. In addition, the LDD region is also provided between the channel region CH and the drain region D on each of the both sides. In such a manner, the TFTs each having the top-gate structure are formed on both the element region side and the peripheral circuit region side of the insulating substrate 201 integrally with each other, respectively. It is noted that the polysilicon film 203 is patterned into island shape so as to correspond to the element regions of the TFTs.

Figure 4F:
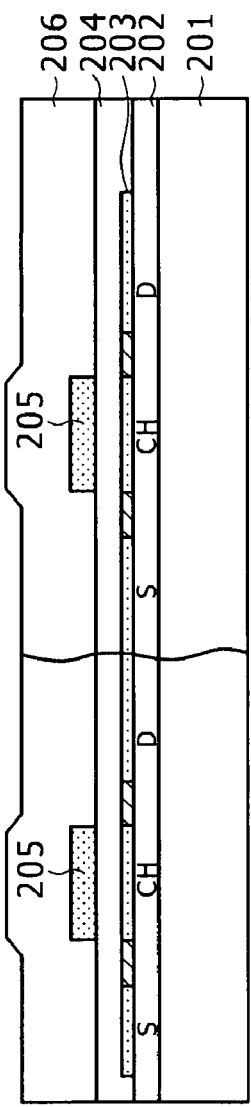

Next, as shown in FIG. 4F, the TFTs are covered with an interlayer insulating film 206. The interlayer insulating film 206, for example, is composed of a lamination layer having a silicon oxide film with 300 nm thickness, and a silicon nitride film with 300 nm thickness. The interlayer insulating film 206 is deposited by utilizing the plasma CVD method. Subsequently, an annealing treatment is carried out at about 400° C., thereby hydrogenating the polysilicon film 203.

Figure 4G:
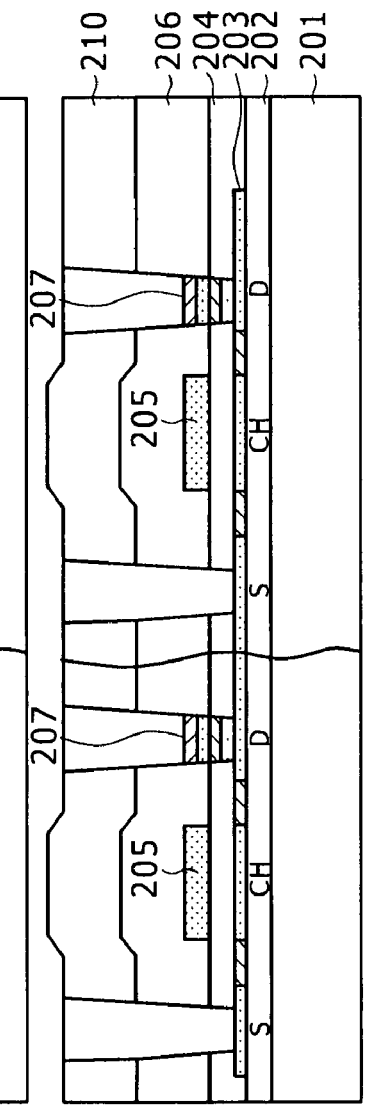

Next, as shown in FIG. 4G, a photo resist 210 is applied to the interlayer insulating film 206 and is then patterned into a predetermined shape by utilizing the photolithography technique. The dry etching is carried out for the interlayer insulating film 206 with the photo resist 210 thus patterned as a mask, thereby opening contact holes in the interlayer insulating film 206. The contact holes are communicated with the drain regions D of the TFTs, respectively. Moreover, metallic films and metallic oxide films are continuously deposited into a lamination layer with the photo resist 210 being left, thereby forming resistance change elements ReRAMs 207 in the contact holes, respectively. As shown in the figure, lower conductive layers of the resistance change elements ReRAMs 207 contact the drain regions D of the TFTs 205, respectively. It is noted that each of the resistance change elements ReRAMs 207 formed in the process shown in FIG. 2G, for example, has the lamination structure composed of Pt/TiO/Pt, Pt/NiO/Pt, Pt/NiO/TiO/Pt, W/GdO/CuTe/W, Ag/PCMO/Pt, TiN/CuO/Cu, or the like.

Figure 4H:
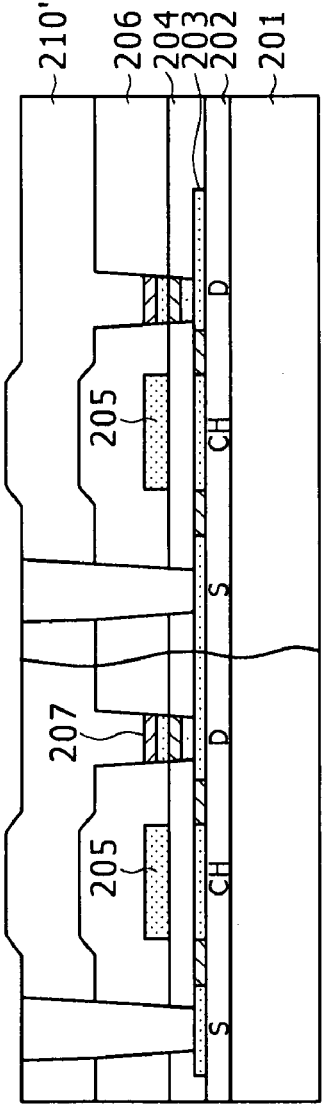

Next, as shown in FIG. 4H, after the used photo resist 210 is removed, a photo resist 210' is newly applied. The photo resist 210' is then patterned by utilizing the photolithography technique. The dry etching is carried out for the interlayer insulating film 206 and the gate insulating film 204 again with the photo resist 210' thus patterned as a mask, thereby opening contact holes which are communicated with the source regions S of the TFTs, respectively, in the interlayer insulating film 206 and the gate insulating film 204.

Figure 4I:
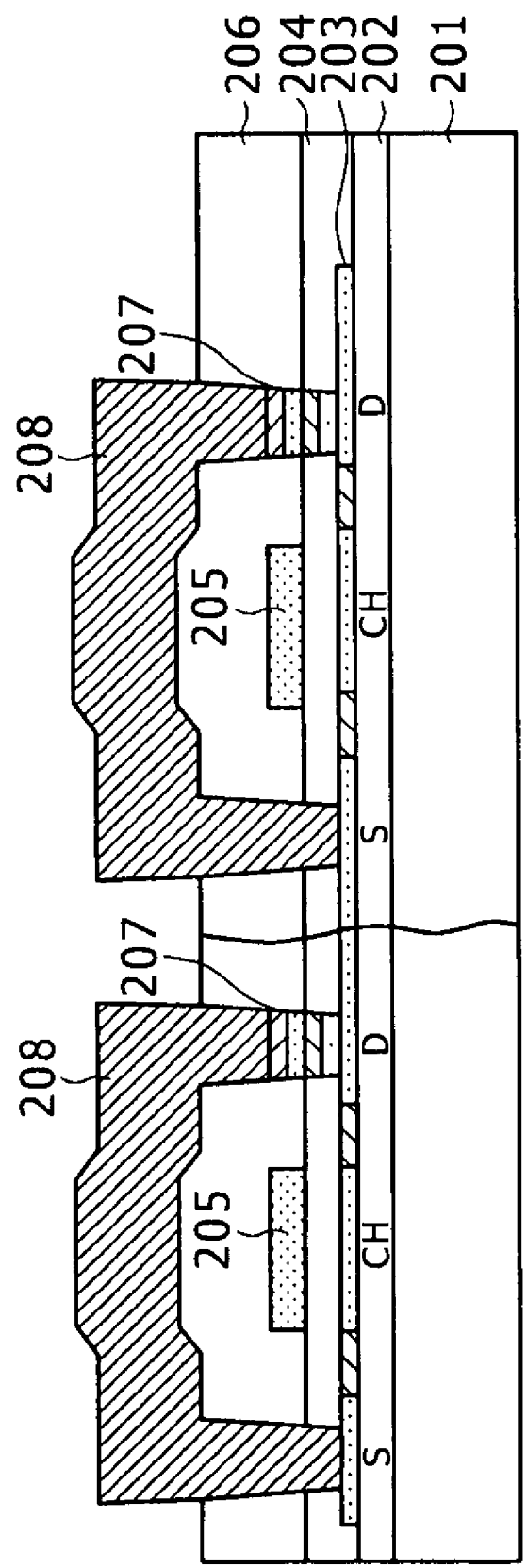

Next, as shown in FIG. 4I, after the used photo resist 210' is removed, a metallic film 208 is laminated on the interlayer insulating film 206. The metallic film 208, for example, has a lamination structure having a titanium lower layer with 50 nm thickness, an aluminum middle layer with 500 nm thickness, and a titanium upper layer with 50 nm thickness. The metallic film 208 is patterned into a predetermined shape to be made metallic wirings 208. As shown in FIG. 4I, the upper conductive layers of the resistance change elements ReRAMs 207 are connected to the source regions S of the TFTs through the metallic wirings 208, respectively. On the other hand, the lower conductive layers of the resistance change elements ReRAMs 207 are directly connected to the drain regions D of the TFTs, respectively. In such a manner, in the second embodiment, the TFTs and the resistance change elements ReRAMs 207 are connected to each other through the wirings (that is, the drain regions D) in the same layer as that of the semiconductor thin film 203 in which the channel regions CH are formed.

The memory element composed of the parallel combination of the TFT and the resistance change element ReRAM is formed in the pixel region on the insulating substrate 201, and the memory element composed of the parallel combination of the TFT and the resistance change element ReRAM is also formed in the peripheral circuit region on the same insulating substrate 201. The peripheral circuit includes a drive circuit for driving a gate line and a data line formed on the pixel side. The drive circuit includes the memory element composed of the parallel combination of the TFT and resistance change element ReRAM described above as the circuit elements. The memory element, for example, is used for holding the gradation data in the inside of the drive circuit.

Figure 5:
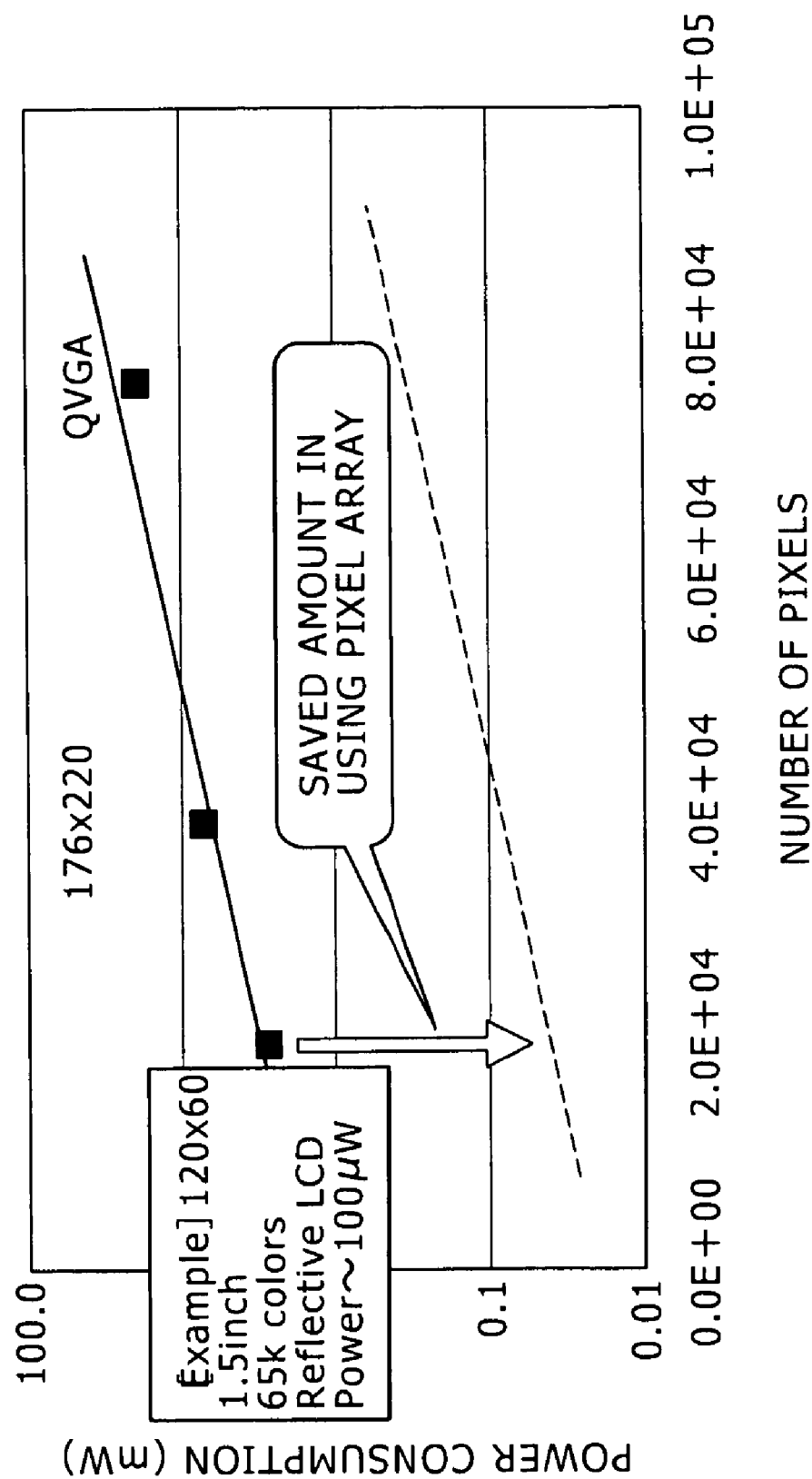
FIG. 5 is a graph showing a relationship between the number of pixels, and power consumption.

FIG. 5 is a graph showing the effect of the embodiments of the present invention. In the figure, an axis of abscissa represents the number of pixels, and an axis of ordinate represents power consumption. In the case of a liquid crystal display panel having the pixels of 120×60, when no pixel memory is used, the power consumption is about 20 mW. On the other hand, when the pixel memory of the embodiments of the present invention is incorporated in the liquid crystal display panel, the power consumption is reduced to 0.1 mW or less. As a result, the large power consumption saving can be attained, and thus the active matrix type liquid crystal display device of the embodiments of the present invention is suitable for application of a liquid crystal display device of mobile terminal equipment, or the like. Likewise, even in the case of a liquid crystal display panel having pixels of 170×220, an amount of power consumption saved by using the pixel memory of the embodiments of the present invention is very large. This also applies a liquid crystal display panel complying with the QVGA (Quarter Video Graphics Array) standards.

Examples of Application

Figure 6:
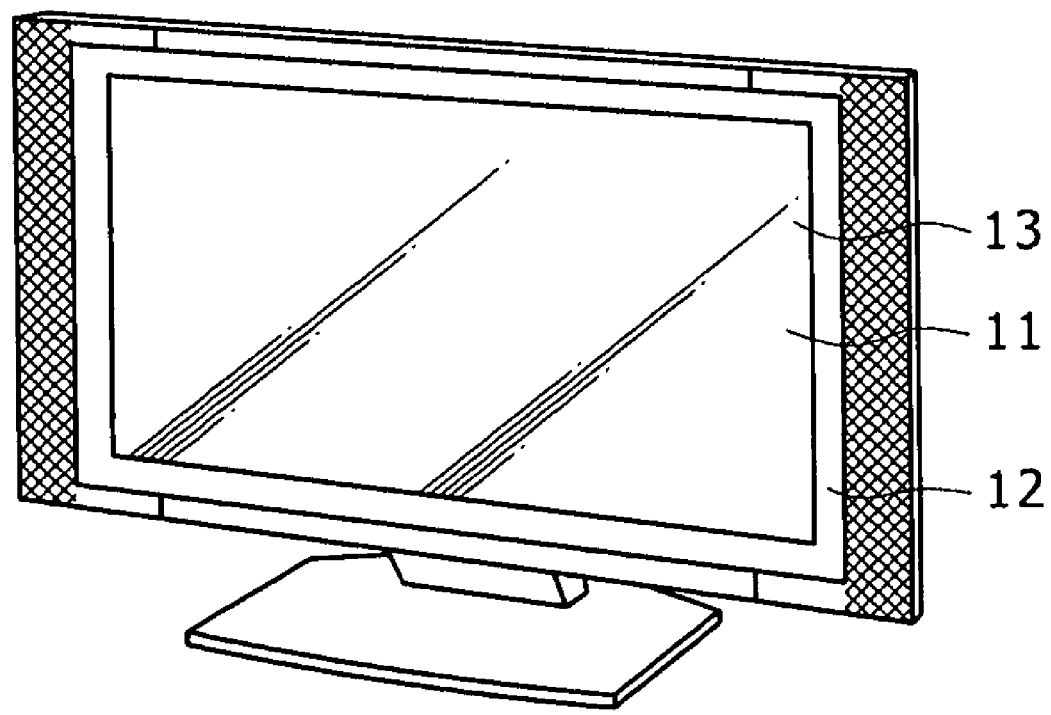
FIG. 6 is a perspective view of a television set as an example of application which includes the liquid crystal display device of the embodiments of the present invention.

FIG. 6 is a perspective view showing a television set to which the embodiments of the present invention is applied. The television set according to this example of application includes an image display screen portion 11 composed of a front panel 12, a filter glass 13, and the like. Also, the television set is manufactured by using the display device according to the embodiments of the present invention as the image display screen portion 11.

Figure 7A:
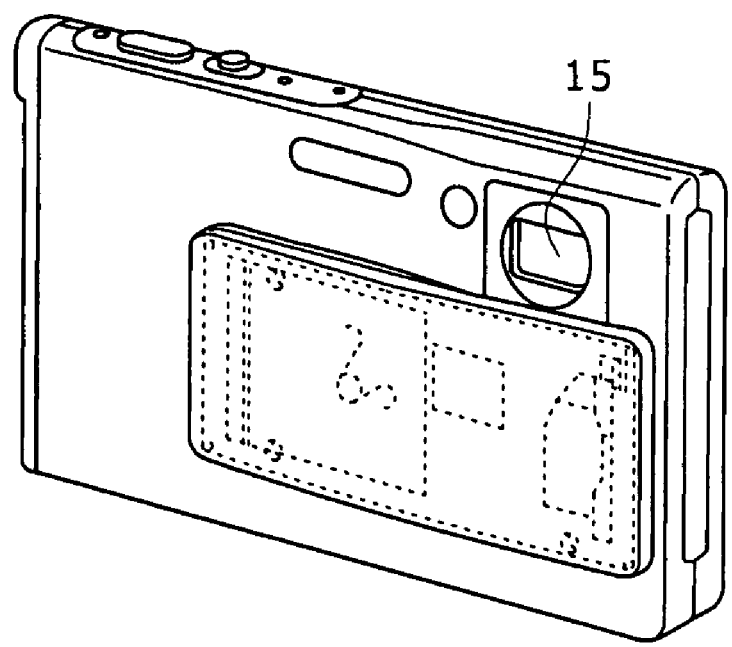
FIGS. 7A and 7B are respectively a perspective view of a digital still camera as another example of application, when viewed from a front side, which includes the liquid crystal display device of the embodiments of the present invention, and a perspective view of the digital still camera as another example of application, when viewed from a back side, which includes the liquid crystal display device of the embodiments of the present invention.
Figure 7B:
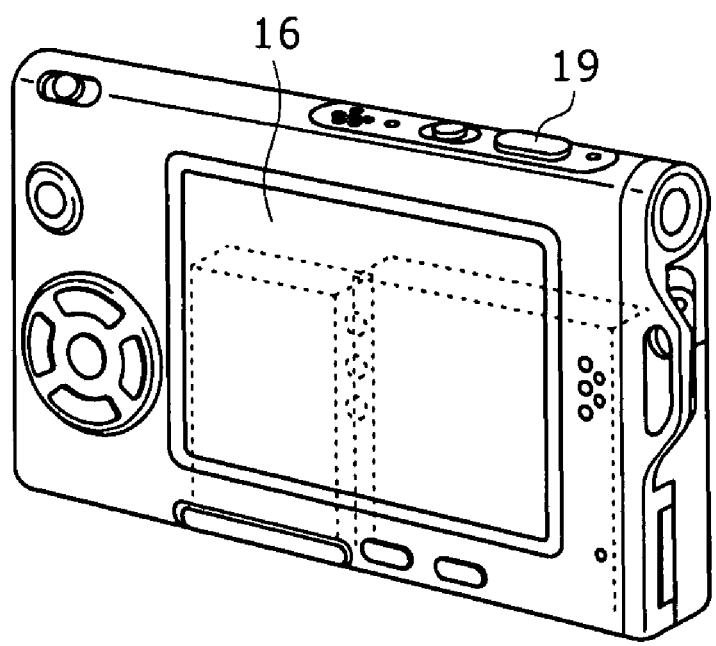

FIGS. 7A and 7B are respectively perspective views showing a digital camera to which the embodiments of the present invention are applied. FIG. 7A is a perspective view when the digital camera is viewed from a front side, and FIG. 7B is a perspective view when the digital camera is viewed from a back side. The digital camera according to this example of application includes an image capturing lens, a light emitting portion 15 for flash, a display portion 16, a control switch, a menu switch, a shutter button 19, and the like. The digital camera is manufactured by using the display device according to the embodiments of the present invention as the display portion 16.

Figure 8:
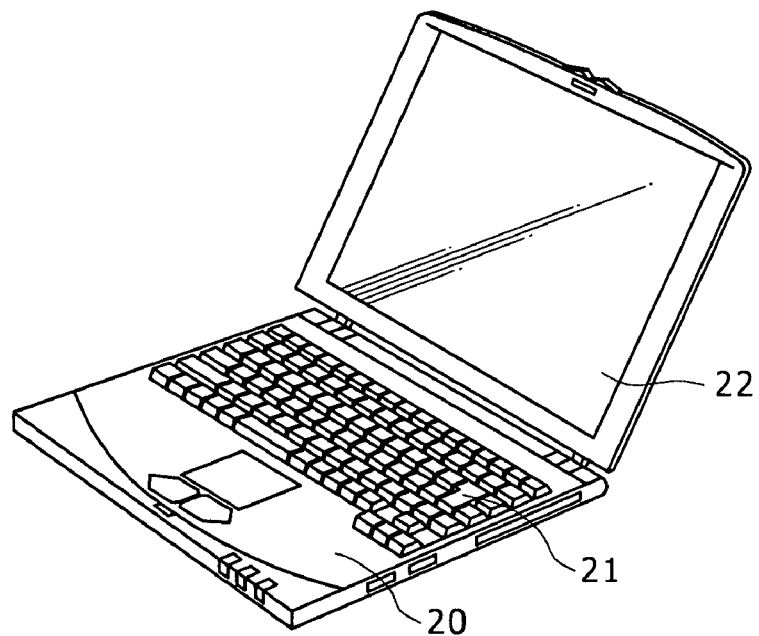
FIG. 8 is a perspective view showing a notebook-size personal computer as still another example of application which includes the liquid crystal display device of the embodiments of the present invention.

FIG. 8 is a perspective view showing a notebook-size personal computer to which the embodiments of the present invention are applied. The notebook-size personal computer according to this example of application includes a main body 20 and a main body cover. The main body 20 includes a keyboard 21 which is operated when characters or the like are inputted. The main body cover includes a display portion 22 for displaying thereon an image. The notebook-size personal computer is manufactured by using the display device according to the embodiments of the present invention as the display portion 22.

Figure 9A:
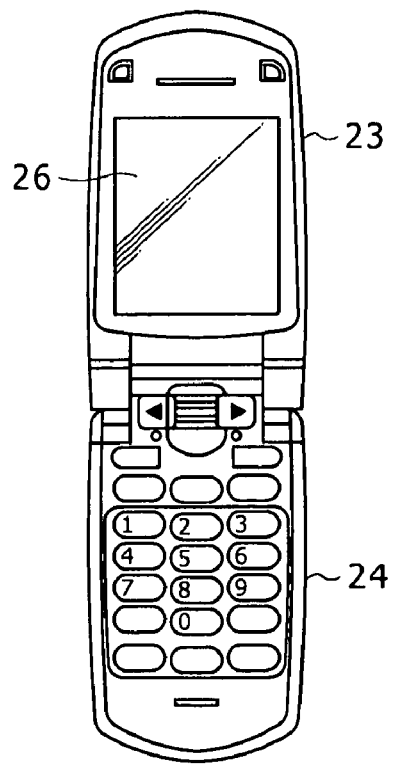
FIGS. 9A and 9B are respectively a front view of mobile terminal equipment as yet another example of application, in an open state, which includes the liquid crystal display device of the embodiments of the present invention, and a front view of the mobile terminal equipment as the yet another example of application, in a close state, which includes the liquid crystal display device of the embodiments of the present invention.
Figure 9B:
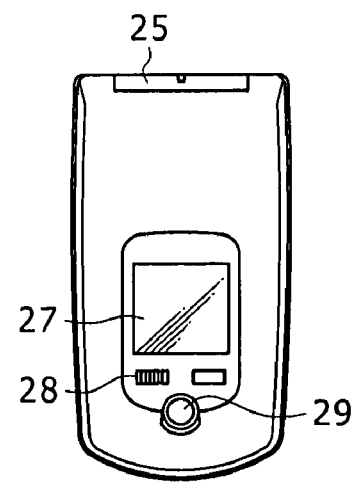

FIGS. 9A and 9B are respectively views each showing mobile terminal equipment to which the embodiments of the present invention are applied. FIG. 9A is a front view in an open state of the mobile terminal equipment, and FIG. 9B is a front view in a close state of the mobile terminal equipment. The mobile terminal equipment according to this example of application includes an upper chassis 23, a lower chassis 24, a connection portion (a hinge portion in this case) 25, a display portion 26, a sub-display portion 27, a picture light 28, a camera 29, and the like. The mobile terminal equipment is manufactured by using the display device according to the embodiments of the present invention as the display portion 26 or the sub-display portion 27. Since in the display device of the embodiments of the present invention, the multiple bit memory can be built in the pixel, it is possible to reduce the power consumption, desired for the charge and discharge of the data lines, occupying the most part of the power consumption in the display panel except for the backlight. Therefore, it is possible to realize the liquid crystal display panel, of the active matrix type liquid crystal display device panel, which can be driven with the low power consumption. Incorporating such a liquid crystal display panel in a monitor of the mobile terminal equipment results in that the battery volume can be reduced as well as the intervals of the charging of the buttery can be prolonged. As a result, the mobile terminal equipment can be further miniaturized.

Figure 10:
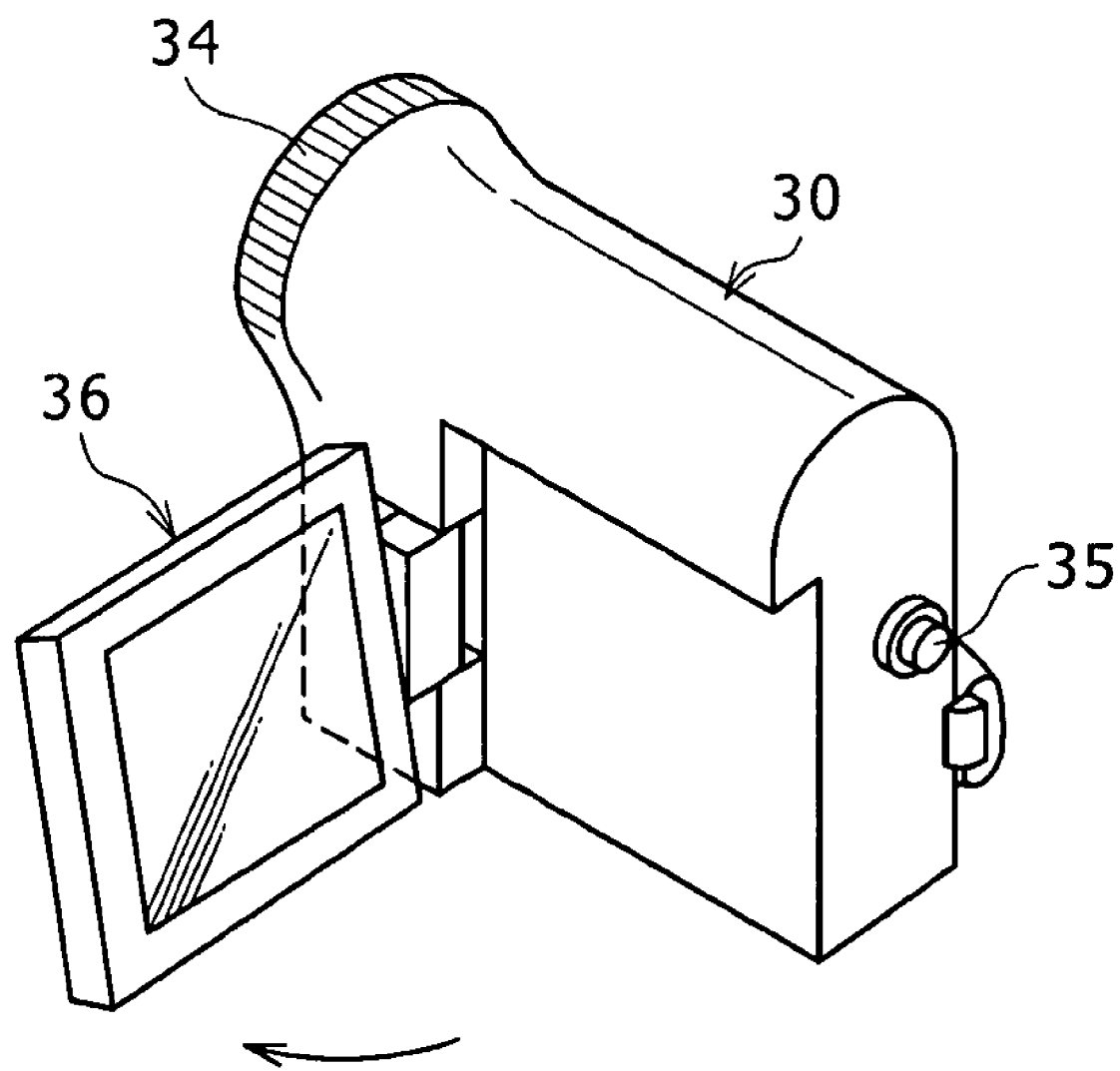
FIG. 10 is a perspective view showing a video camera, as a further example of application, which includes the liquid crystal display device of the embodiments of the present invention.

FIG. 10 is a perspective view showing a video camera to which the embodiments of the present invention are applied. The video camera according to this example of application includes a main body portion 30, a lens 34 which captures an image of a subject and which is provided on a side surface directed forward, a start/stop switch 35 which is manipulated when an image of a subject is captured, a monitor 36, and the like. The video camera is manufactured by using the display device according to the embodiments of the present invention as the monitor 36.

Third Embodiment

STRUCTURAL EXAMPLE 2 OF RESISTANCE CHANGE ELEMENT

Figure 11A:
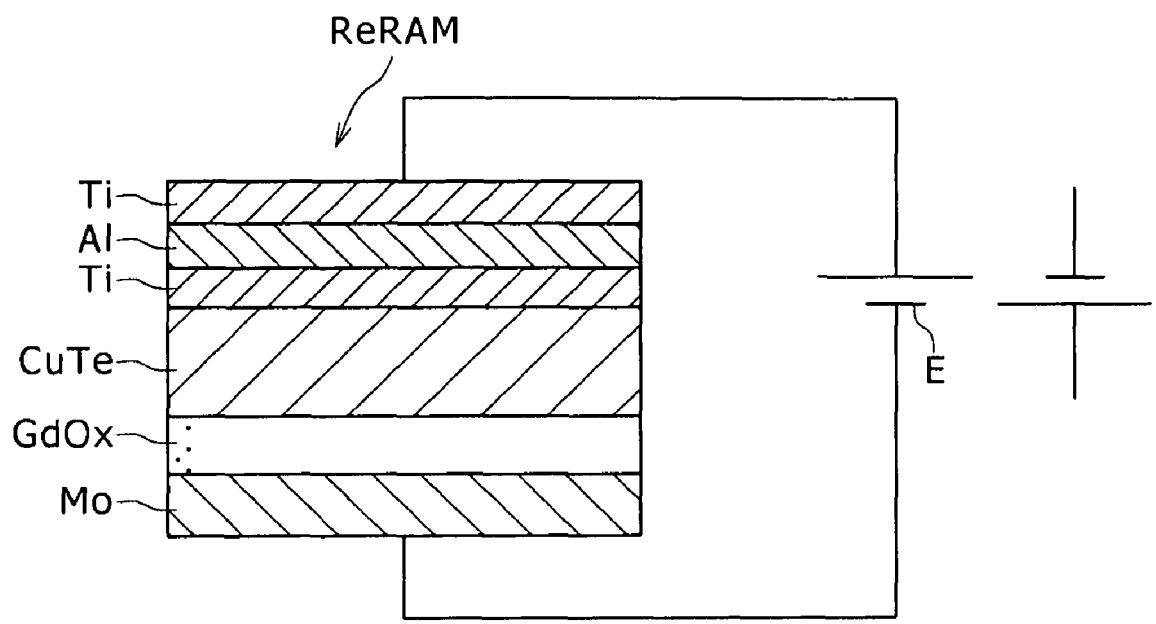
FIG. 11A is a schematic view showing another structure of the resistance change element incorporated in the memory element.

FIG. 11A is a schematic cross sectional view showing another structural example of the resistance change element ReRAM. As shown in the figure, the resistance change element ReRAM is composed of a pair of conductive layers, and at least one oxide film layer disposed between the paired conductive layers. In this structural example, the upper conductive layer has a four-layer structure composed of Ti/Al/Ti/CuTe. Of the four layers, the three layers of Ti/Al/Ti are formed from a composite metallic film which is in heavy usage as the wiring layer in the normal thin film semiconductor device or the like. Also, a CuTe alloy layer as the fourth layer serves as a functional layer of the resistance change element ReRAM.

On the other hand, the lower conductive layer (electrode layer) is made of a metal (Mo: molybdenum). Molybdenum Mo as the high-melting-point metal, for example, is in heavy usage as the gate electrode and the gate wiring in the normal thin film transistor manufacturing processes. It is noted that the upper electrode and the lower electrode shown in FIG. 11A are merely illustrative, and thus in the actual structure, the vertical relationship is by no means limited to the structural example shown in FIG. 11A.

The middle oxide layer sandwiched between the upper and lower conductive layers is made of $GdO_x$. This metallic oxide $GdO_x$ is an unfamiliar material in the normal thin film semiconductor processes. With such a structure, as shown in FIG. 11A, when a set voltage E having a positive polarity is applied to the upper conductive layer with a voltage at the lower conductive layer as a reference, the resistance change element ReRAM is set in the low resistance state LRS. That is to say, Cu atoms contained in the conductive fourth layer made of CuTe move to the oxide film layer made of $GdO_x$ in accordance with the set voltage E to form fine current path (filament). As a result, the electrical resistance of the oxide film layer made of $GdO_x$ decreases, so that the resistance change element ReRAM is set in the low resistance state LRS.

On the other hand, when the polarities of the voltages applied to the upper and lower conductive layers, respectively, are inverted, the Cu atoms which have moved to the oxide film layer made of $GdO_x$ return back to the conductive fourth layer CuTe, so that the fine current path (filament) disappears. The application of the reset voltage having the negative polarity resets the resistance change element ReRAM, so that the resistance change element ReRAM is set in the high resistance state HRS. Actually, however, the application of the reset voltage results in that the metal Mo atoms diffuse into the oxide film layer made of $GdO_x$ to reduce the electrical resistance of the oxide film layer made of $GdO_x$. The migration of the metal Mo progresses by repetitively carrying out the set/reset operation. Before long, the reset from the low resistance state LRS to the high resistance state HRS may become impossible, so that the life of the migration of the metal Mo comes to an end. In addition, the oxide film layer made of $GdO_x$ is poor in consistency with any other material in the normal thin film semiconductor processes, and has a difficulty in the processing property as well.

STRUCTURAL EXAMPLE 3 OF RESISTANCE CHANGE ELEMENT

Figure 11B:
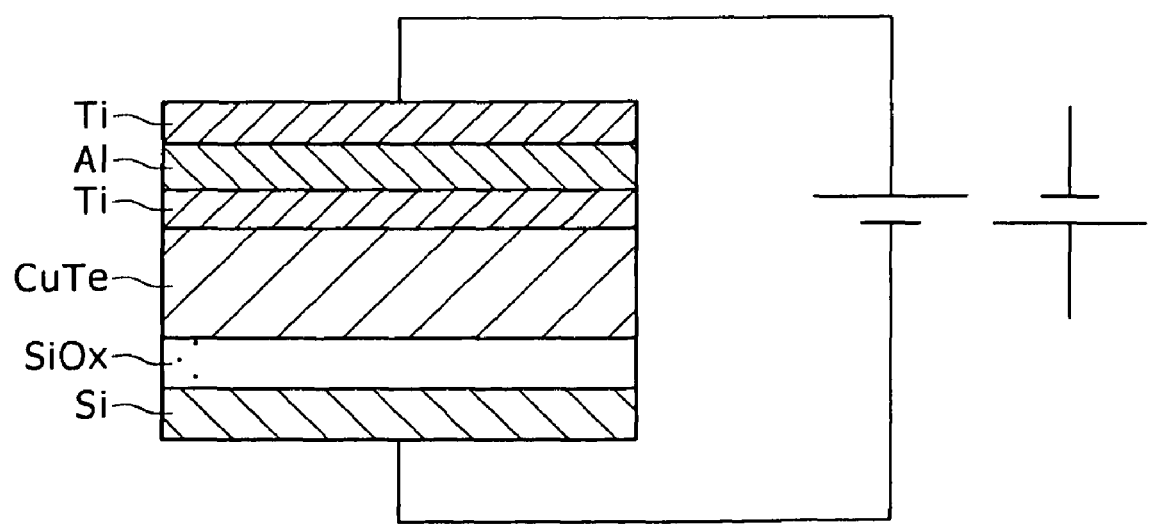
FIG. 11B is a schematic view showing still another structure of the resistance change element incorporated in the memory element.

FIG. 11B is a schematic cross sectional view showing still another structural example of the resistance change element ReRAM. Although the still another structural example of the resistance change element ReRAM is basically similar to another structural example of the resistance change element ReRAM shown in FIG. 11A, the still another structural example is different in materials of the middle oxide film layer and the lower conductive layer from another structural example. In this structural example, the middle oxide film layer is made of $SiO_x$ instead of being made of $GdO_x$. $SiO_x$ is generally used as the material for the gate insulating film or passivation film of the thin film transistor TFT. In addition, the lower conductive layer is made of silicon Si (doped Si) which is doped with an impurity at a high concentration to be given a conductive property instead of being made of the high-melting-point metal Mo. The doped Si is generally used as the material for the source/drain electrode or wiring of the thin film transistor TFT.

In this structural example, the oxide film layer is made of $SiO_x$, and the lower conductive layer is made of doped Si, thereby lengthening the life of the resistance change element ReRAM. With this structural example, the migration of the metal from the lower conductive layer to the middle oxide film layer hardly occurs. If Si atoms diffuse into the oxide film layer made of $SiO_x$, the electrical resistance of the oxide film layer is hardly reduced. As a result, the life of the resistance change element ReRAM can be made longer than that of the resistance change element ReRAM in another structural example shown in FIG. 11A.

Structure of Memory Element

Figure 11C:
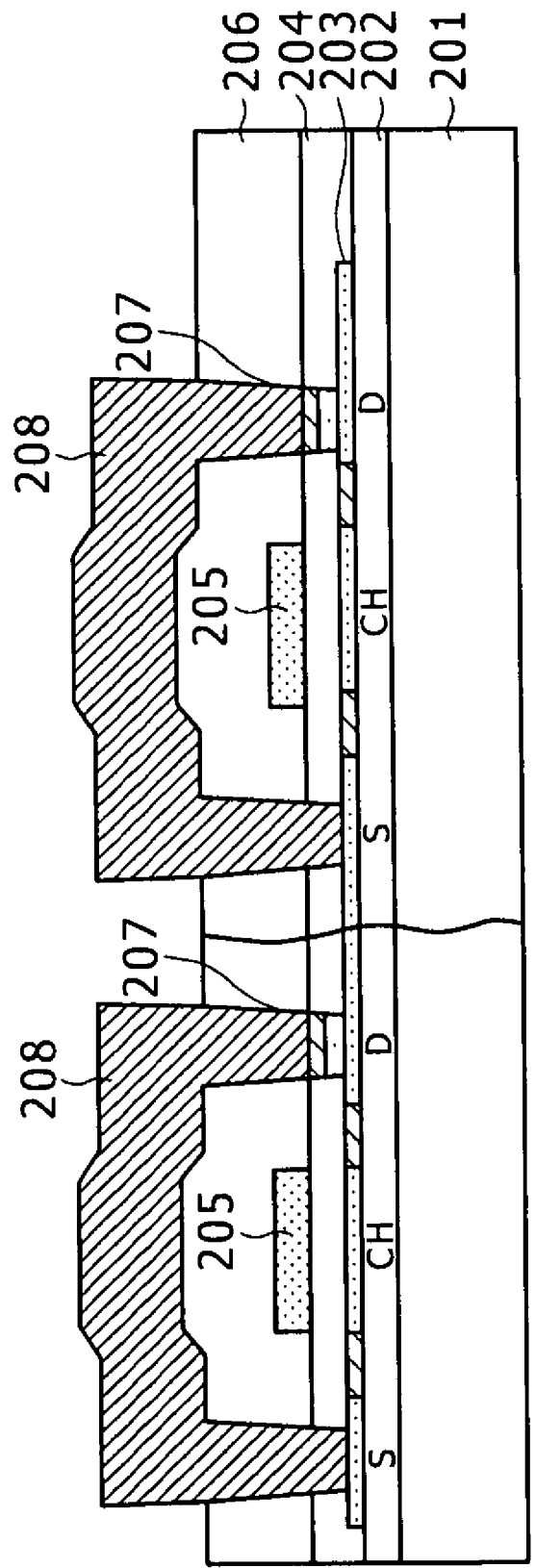
FIG. 11C is a schematic cross sectional view showing a structure of the memory element according to a third embodiment of the present invention.

FIG. 11C is a schematic cross sectional showing a structure of a memory element according to a third embodiment of the present invention. The memory element of the third embodiment is basically similar to the memory element of the second embodiment shown in FIG. 4I except for the structure of the resistance change element ReRAM 207. In the third embodiment, the resistance change element ReRAM 207 adopts the structure shown in FIG. 11B. That is to say, the resistance change element ReRAM has a lamination layer structure which is obtained by laminating the upper conductive layer formed from the metallic film 208 having the three-layer structure of Ti/Al/Ti on an alloy layer of CuTe. Here, the metallic film 208 having the three-layer structure of Ti/Al/Ti is used as the wiring of the TFT 205, and is in heavy usage in the TFT process.

On the other hand, in the resistance change element ReRAM, the lower conductive layer is formed from the polysilicon film 203. The polysilicon film 203 is doped with an impurity at a high concentration to be given the conductive property. In the third embodiment, the lower conductive layer corresponds to an extension portion of the polysilicon film 203 composing each of the drain regions D of the TFTS. In such a manner, the drain electrode of the TFT is shared with the electrode layer of the resistance change element ReRAM 207, thereby making it possible to increase the integration density of the memory elements.

The middle oxide film layer is made of $SiO_x$. $SiO_x$, for example, is formed by thermally oxidizing the surface of the polysilicon film 203. Or, $SiO_x$ is formed on the polysilicon film 203 by utilizing a plasma enhanced chemical vapor deposition (PECVD) method or a sputtering method. These deposition methods are generally used in the TFT process. As apparent from the above description, all the materials except for CuTe are generally used in the normal TFT process, and thus are suitable for forming the memory elements each composed of the combination of the TFT and the resistance change element ReRAM integrally with one another.

It should be understood by those skilled in the art that various modifications, combinations, sub-combinations and alterations may occur depending on design requirements and other factor in so far as they are within the scope of the appended claims or the equivalents thereof.

What is claimed is:

1. A memory element, comprising a parallel combination of
   a thin film transistor; and
   a resistance change element,
   said thin film transistor including
      a semiconductor thin film in which a channel region, and an input terminal and an output terminal located on both sides of said channel region, respectively, are formed, and
      a gate electrode overlapping the channel region through an insulating film to become a control terminal,
   said resistance change element including
      one conductive layer connected to the input terminal side of said thin film transistor,
      the other conductive layer connected to the output terminal side of said thin film transistor, and
      at least one oxide film layer disposed between said one conductive layer and the other conductive layer,
   wherein when said thin film transistor is in an OFF state in accordance with a voltage applied to said control terminal of said thin film transistor, said resistance change element changes between a low resistance state and a high resistance state in accordance with a voltage applied thereto from said input terminal of said thin film transistor, thereby writing corresponding binary data to said resistance change element, and
   wherein said thin film transistor and said resistance change element are connected to each other through a wiring in the same layer as that of said gate electrode.

2. The memory element according to claim 1, wherein a plurality of stages of the parallel combinations of the thin film transistors and the resistance change elements are connected in series with one another, and
   by controlling the voltages applied to the control terminals of the thin film transistors in said plurality of stages, respectively, the binary data written to the resistance change element in the same stage is read out.

3. The memory element according to claim 1, wherein said thin film transistor and said resistance change element are connected to each other through a wiring in the same layer as that of said semiconductor thin film having said channel region formed therein.

4. The memory element according to claim 1, wherein in said resistance change element, said oxide film layer disposed between said one conductive layer and the other conductive layer is made of $SiO_x$.

5. The memory element according to claim 4, wherein in said resistance change element, one of said one conductive layer and the other conductive layer is made of doped Si.

6. A display device, comprising
   gate lines wired in rows;
   data lines wired in columns; and
   pixels disposed in portions in which said gate lines and said data lines intersect with each other, respectively,
   each of said pixels including
      a memory element, and
      an electro-optic element,
   said memory element serving to store therein data supplied thereto from the corresponding one of said data lines, and to read out data in accordance with a signal supplied thereto from the corresponding one of said gate lines,
   said electro-optic element exhibiting a luminance corresponding to the data stored in said memory element,
   said memory element including
      a parallel combination of a thin film transistor, and
      a resistance change element,
   said thin film transistor including
      a semiconductor thin film in which a channel region and an input terminal and an output terminal located on both sides of said channel region, respectively, are formed, and
      a gate electrode overlapping said channel region through an insulating film to become a control terminal,
   said resistance change element including
      one conductive layer connected to the input terminal side of said thin film transistor,
      the other conductive layer connected to the output terminal side of said thin film transistor, and
      at least one oxide film layer disposed between said one conductive layer and the other conductive layer,
   wherein when said thin film transistor is in an OFF state in accordance with a voltage applied from the corresponding one of said gate lines to said control terminal of said thin film transistor, said resistance change element changes between a low resistance state and a high resistance state in accordance with data supplied from the corresponding one of said data lines to said input terminal of said thin film transistor, thereby writing the data to said resistance change element, and
   wherein each of said pixel comprises
   a plurality of memory elements connected in series between said data line and said electro-optic element,
   said plurality of memory elements are controlled in a time division manner through said plurality of gate lines corresponding to said plurality of memory elements. respectively, thereby writing multiple bit data corresponding to multiple gradations, respectively, to said plurality of memory elements, and
   said electro-optic element is driven in the time division manner in correspondence to the multiple bit data thus written, thereby controlling a luminance of said electro-optic element with multiple gradations.

7. The display device according to claim 6, wherein said gate lines wired in rows, said data lines wired in columns, and said pixels disposed in said portions in which said gate lines wired in rows and said data lines wired in columns intersect with each other, respectively, are formed on a substrate integrally with one another, and a drive circuit for driving said gate lines wired in rows and said data lines wired in columns is formed on the same substrate, and
   said driving circuit also includes said memory element as a circuit element.

8. The display device according to claim 6, wherein in said resistance change element, said oxide film layer disposed between said one conductive layer and the other conductive layer is made of $SiO_x$.

9. The display device according to claim 8, wherein in said resistance change element, one of said one conductive layer and the other conductive layer is made of doped Si.

* * * * *